(12) United States Patent
Chang et al.

(10) Patent No.: US 8,288,236 B2
(45) Date of Patent: Oct. 16, 2012

(54) FIELD EFFECT TRANSISTOR HAVING NANOSTRUCTURE CHANNEL

(75) Inventors: Josephine B. Chang, Mahopac, NY (US); Michael A. Guillorn, Yorktown Heights, NY (US); Eric A. Joseph, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/345,252

(22) Filed: Jan. 6, 2012

(65) Prior Publication Data

US 2012/0108024 A1 May 3, 2012

Related U.S. Application Data

(62) Division of application No. 12/627,057, filed on Nov. 30, 2009.

(51) Int. Cl.
*H01L 21/336* (2006.01)

(52) U.S. Cl. .......... 438/299; 438/270; 438/590; 257/24; 257/E51.04; 257/E29.061; 257/E21.409; 977/938

(58) Field of Classification Search .................. 438/299, 438/270, 590; 257/24, E51.04, E29.061, 257/E21.409; 977/938
See application file for complete search history.

(56) References Cited

U.S. PATENT DOCUMENTS

| | | | |
|---|---|---|---|
| 5,382,822 A | 1/1995 | Stein | |
| 5,559,367 A | 9/1996 | Cohen et al. | |
| 5,970,339 A | 10/1999 | Choi | |
| 6,062,931 A | 5/2000 | Chuang et al. | |
| 6,923,946 B2 | 8/2005 | Geohegan et al. | |
| 6,949,237 B2 | 9/2005 | Smalley et al. | |
| 7,105,428 B2 | 9/2006 | Pan et al. | |
| 7,357,906 B2 | 4/2008 | Colbert et al. | |
| 7,399,691 B2 | 7/2008 | Lieber et al. | |
| 7,425,487 B2 | 9/2008 | Kreupl et al. | |
| 7,425,491 B2 | 9/2008 | Forbes | |
| 7,534,675 B2 | 5/2009 | Bangsaruntip et al. | |
| 7,566,945 B2 * | 7/2009 | Choi et al. | 257/522 |
| 7,598,516 B2 | 10/2009 | Avouris et al. | |
| 7,858,989 B2 | 12/2010 | Chen et al. | |
| 2004/0164327 A1 | 8/2004 | Shin et al. | |
| 2005/0093425 A1 | 5/2005 | Sugiyama | |
| 2007/0281409 A1 | 12/2007 | Zhang et al. | |
| 2008/0067495 A1 | 3/2008 | Verhulst | |

(Continued)

FOREIGN PATENT DOCUMENTS

JP 2006245127 A 9/2006

(Continued)

OTHER PUBLICATIONS

Non-final Office Action dated Nov. 29, 2011 for U.S. Appl. No. 12/627,120.

(Continued)

*Primary Examiner* — Tu-Tu Ho
(74) *Attorney, Agent, or Firm* — Cantor Colburn LLP; Vazken Alexanian

(57) ABSTRACT

A field effect transistor (FET) includes a drain formed of a first material, a source formed of the first material, a channel formed by a nanostructure coupling the source to the drain, and a gate formed between the source and the drain and surrounding the nanostructure.

12 Claims, 6 Drawing Sheets

U.S. PATENT DOCUMENTS

| | | |
|---|---|---|
| 2008/0128760 A1 | 6/2008 | Jun et al. |
| 2008/0169563 A1 | 7/2008 | Awano et al. |
| 2008/0277648 A1 | 11/2008 | Wakita |
| 2009/0169919 A1 | 7/2009 | Garcia et al. |
| 2011/0110141 A1 | 5/2011 | Tran |

FOREIGN PATENT DOCUMENTS

| | | |
|---|---|---|
| JP | 2008084892 A | 10/2008 |

OTHER PUBLICATIONS

International Search Report and Written Opinion, Mailed Feb. 4, 2011, International Appln. No. PCT/EP2010/066817, Written Opinion 7 Pages, International Search Report 3 Pages.

\* cited by examiner

FIELD EFFECT TRANSISTOR HAVING NANOSTRUCTURE CHANNEL

CROSS-REFERENCE TO RELATED APPLICATIONS AND PRIORITY CLAIM

This application is a divisional of and claims priority to U.S. Non-provisional application Ser. No. 12/627,057, entitled "FIELD EFFECT TRANSISTOR HAVING NANOSTRUCTURE CHANNEL", filed Nov. 30, 2009, which is incorporated herein by reference in its entirety.

BACKGROUND

The present invention relates to transistors, and more specifically, to field effect transistors.

Switching devices based on nanostructures such as carbon nanotubes or semiconducting nanowires have enormous potential due to the high carrier mobility and small dimensions that such nanostructures can provide. However, one of the many challenges a technology based on nanostructures must overcome is compatibility with the high layout density that traditional silicon complementary metal-oxide-semiconductor (CMOS) technology currently supports. For high layout density, the nanostructures and the source/drain and gate contacts to the switching device built around each nanostructure should be precisely positioned. In silicon CMOS, this precise positioning is enabled by lithographic definition of the active area and source/drain junctions which are self-aligned to the gate.

At present, there are several different ways form nanostructures that may be used in switching devices. For example, techniques have been developed to produce nanotubes in sizeable quantities, including arc discharge, laser ablation, high pressure carbon monoxide (HiPCO), and chemical vapor deposition (CVD). Most of these processes take place in vacuum or with process gases. CVD growth of CNTs can occur in vacuum or at atmospheric pressure. Large quantities of nanotubes can be synthesized by these methods; advances in catalysis and continuous growth processes are making CNTs more commercially viable.

Each of these methods requires that the nanostructures be selected and then precisely placed. As will be understood, the placement of these tiny structures may be difficult on the scale of current CMOS technology.

SUMMARY

According to one embodiment of the present invention, a field effect transistor (FET) is disclosed. The FET of this embodiment includes a drain formed of a first material, a source formed of the first material, a channel formed by a nanostructure coupling the source to the drain and a gate formed between the source and the drain and surrounding the nano structure.

According to another embodiment of the present invention a method of forming a field effect transistor (FET) is disclosed. The method of this embodiment includes forming a source/drain (S/D) layer on a substrate, the S/D layer having a first thickness; forming a catalyst layer over the S/D layer; patterning the catalyst layer to create remaining catalyst layer portions; increasing the thickness of the S/D layer from the first thickness to a second thickness greater than the first thickness to encase the remaining catalyst layer portions; dividing the S/D layer into a source and a drain, dividing including exposing portions of the remaining catalyst layer portions, the exposed portions forming catalyst sites; and growing nanostructures between the source and the drain from the catalyst sites.

According to another embodiment of the present invention a method of forming a field effect transistor is disclosed. The method includes forming a source/drain (S/D), wherein forming includes depositing portions of a catalyst layer within the S/D layer; dividing the S/D layer into a source and a drain, dividing including exposing portions of the catalyst layer, the exposed portions forming catalyst sites; and growing nanostructures between the source and the drain from the catalyst sites.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The structure disclosed herein (and the method of forming such a structure) takes advantage of pre-patterned, embedded catalyst lines and a replacement gate process to provide lithographically defined catalyst particles source/drain junctions self-aligned to the gate. By using precisely positioned catalyst particles to grow the nanostructures exactly where they are desired, the need to grow, harvest, and then place the nanostructures is eliminated. Accordingly, field effect transistors (FETs) may be formed having nano structure channels.

Figure 1:
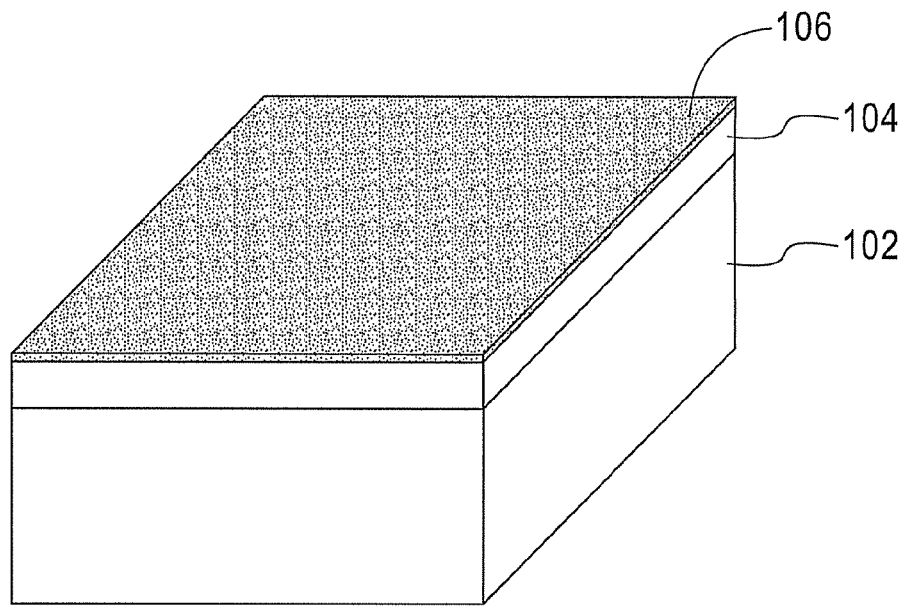
FIG. 1 shows a stage in the process of forming FET according to one embodiment of the present invention.

With reference now to FIG. 1, an example of a structure in the production process of a FET according to one embodiment of the present invention is shown. The wafer includes a substrate 102. The substrate 102 may be formed of any material but, in one embodiment, is formed of silicon with an insulating silicon dioxide ($SiO_2$) on top.

A source/drain (S/D) layer 104 is disposed on top of the substrate 102. The S/D layer 104 may be formed of any electrically conductive or semiconductive material. In one embodiment, the S/D layer 104 is formed of silicon or a silicon-based material which may later be doped or converted to a metal silicide. In another embodiment, the S/D layer 104 is formed of metallic material such as, for example, titanium nitride (TiN).

A catalyst layer 106 is deposited on top of the S/D layer 104. The catalyst layer 106 will be utilized to generate embedded catalyst sites for in-situ nanostructure growth. The composition of the catalyst layer 106 may depend on the type of nanostructure to be created. The catalyst layer 106 may be formed, for example, of iron (Fe), nickel (Ni) or cobalt (Co). In one embodiment, the catalyst layer 106 may be formed of a catalyst and catalyst support materials in a layered film. The thickness of the catalyst layer 106 is variable and will define a thickness catalyst sites formed as described below.

Figure 2:
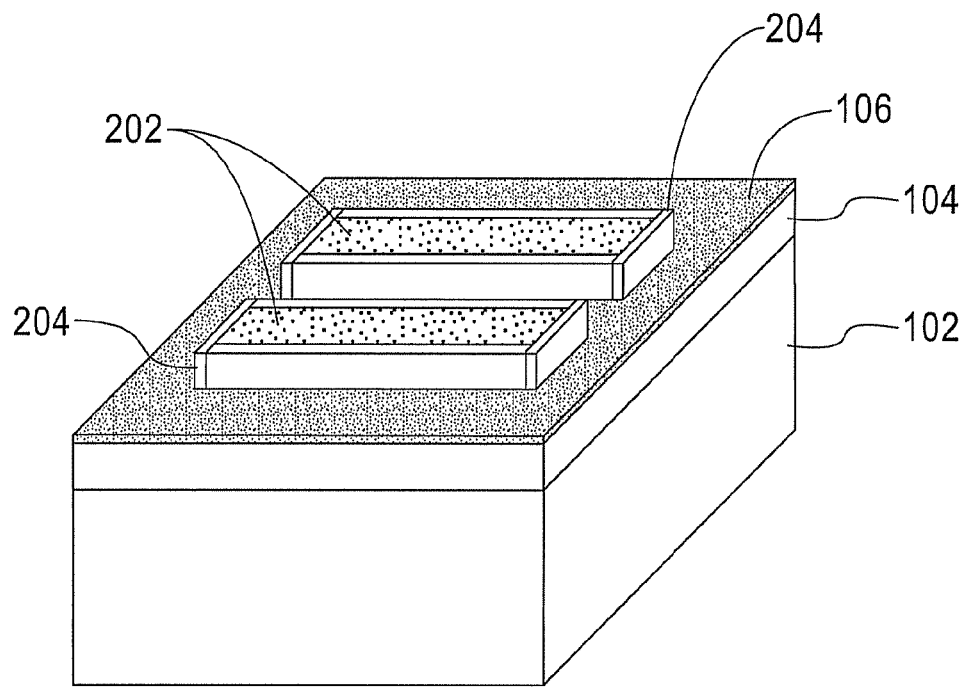
FIG. 2 shows the formation of mandrels and spacers to define a future location of a catalyst site using sidewall image transfer.

FIG. 2 shows the structure of FIG. 1 after mandrels 202 have been formed over the catalyst layer 106. As shown, two mandrels 202 have been formed. However, this is by way of example only and the number may be any number equal to or greater than one. The mandrels 202 may be formed by know patterning techniques. For example, the mandrels 202 may be formed by electron beam lithography. In one embodiment, the mandrels 202 are formed of silicon or silicon dioxide.

In one embodiment, the mandrels 202 themselves will define the shape, size and location of the catalyst locations described below. In such an embodiment, the catalyst layer 106 is etched to remove portions thereof not covered by the mandrels 202.

In one embodiment, the catalyst layer is patterned by a sidewall image transfer (SIT) process, in which the mandrels 202 are used to define walls on to which spacers 204 may be formed. In one embodiment, the spacers 204 may be formed of nitride such as, for example, silicon nitride. The width of the spacers 204 will define a width of a catalyst sites described below. The spacers 204 may be formed, for example, by conformal nitride deposition and spacer reactive ion etching.

Figure 3A:
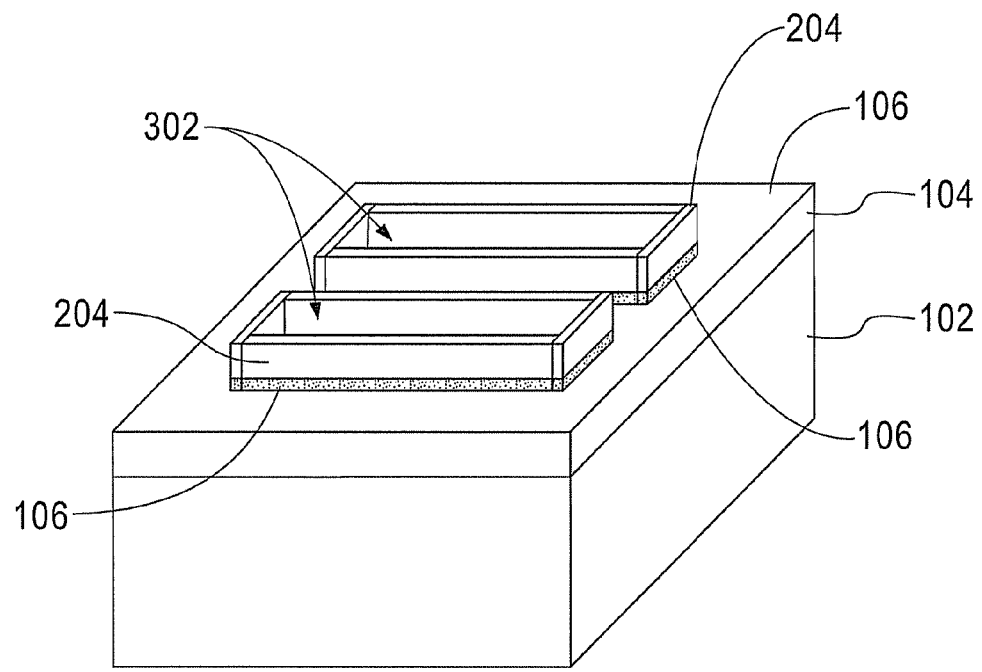
FIG. 3 shows the structure of FIG. 2 after the mandrels have been removed.

FIG. 3a shows the structure of FIG. 2 after mandrels 202 have been removed to create open portions 302. The mandrels 202 may be removed, for example, by reactive ion etching (RIE) or selective wet chemistry. The catalyst layer 106 is then removed from the open portions 302 and all other regions not covered by the spacers 204. The catalyst layer 106 portions to be removed may be removed, for example, by physical sputtering or selective wet chemistry.

Figure 3B:
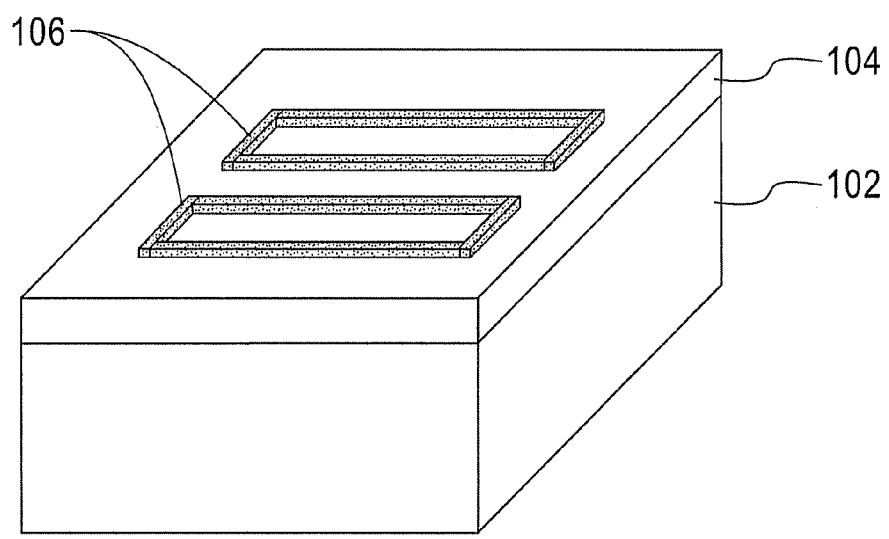

FIG. 3b shows the structure of FIG. 3a after the spacers 204 have been removed leaving only the remaining portions of the catalyst layer 106. Spacers 204 may or may not be removed.

The remaining portions of the catalyst layer 106 will form the catalyst sites described below. As discussed above, the thickness of the catalyst layer 106 defines a thickness of catalyst sites while the spacers or mandrels define the width of the catalyst sites. Current technology allows for the creation of very precise catalyst layer 106 thickness as well as very precise spacer width creation. Accordingly, utilizing the invention disclosed herein may allow for more precisely defined (in terms of size and location) catalyst sites than conventionally utilized. Accurately defining the size and position of the catalyst sites directly affects the formation of consistently sized and placed nanostructures (such as nanowires or nanotubes). Current inability to effectively achieve either or both of these results stands in the way of nanostructures being utilized in CMOS technologies and may be overcome by the teachings herein.

Regardless of whether or not the spacers are removed, the catalyst layer 106 (a spacers 204 if not removed) is then encapsulated by a S/D material 104b which may be the same or different from S/D layer 104.

In addition, the S/D layer 104 and 104b is formed into active regions by removal of non active regions. In one embodiment, active regions can be isolated from one another using shallow trench isolation (where the space between active regions is filled with an STI dielectric 402, for example silicon dioxide) or mesa isolation (where the space between active regions are not filled).

Figure 4:
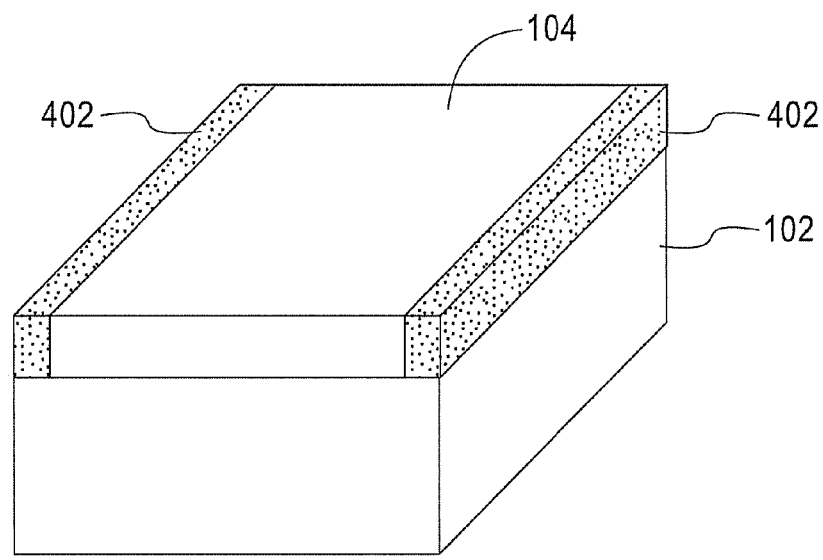
FIG. 4 shows the structure of FIG. 3 after the catalyst layer has been encapsulated, and the active area defined.
Figure 5:
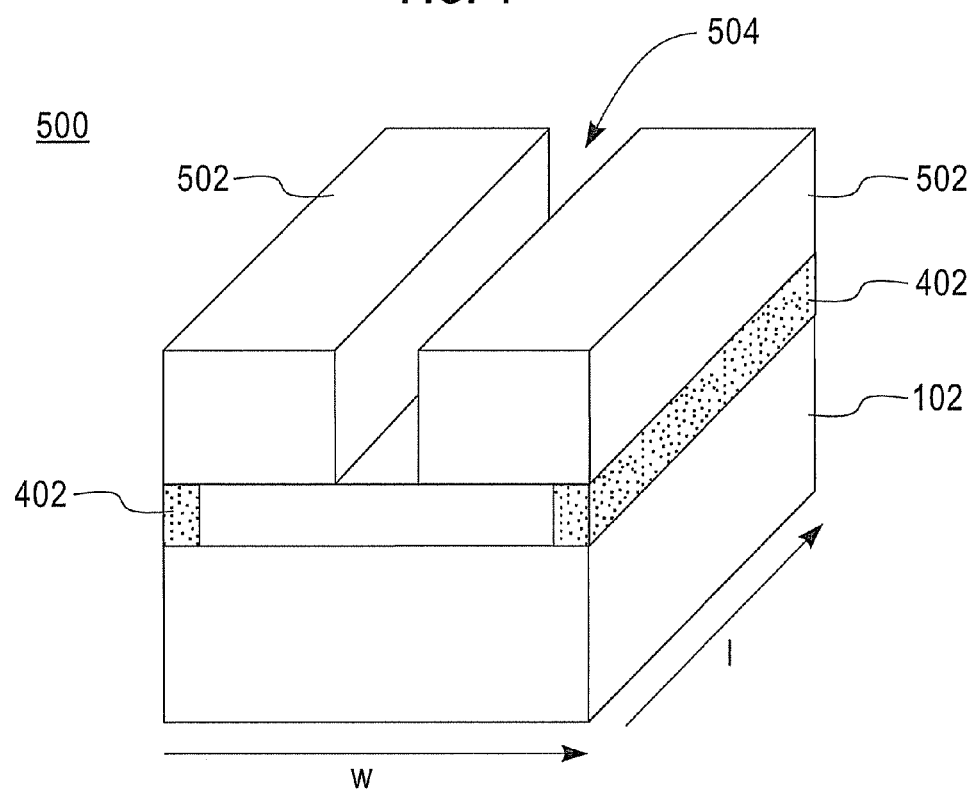
FIG. 5 shows the formation of a removed gate area.

FIG. 5 shows the structure of FIG. 4 with a removed gate region 504. In one embodiment, the removed gate region 504 is formed along a different axis than the mandrels 202 (FIG. 2) were formed. The removed gate region 504 extends from an upper surface of the sidewalls down to the S/D layer 104 (if the gate is above an active region) or STI dielectric 402 (if the gate is above a non-active region and an STI isolation scheme is used) or substrate 102 (if the gate is above a non-active region and a mesa isolation scheme is used)

The removed gate region may be formed by depositing a temporary gate along the length (l) of the structure 500, filling and planarizing with material 502, and then removing the temporary gate to leave the removed gate region 504. Alternatively, the removed gate region 504 could be directly formed in a sidewall layer (leaving sidewalls 502) using known etching techniques.

Figure 6:
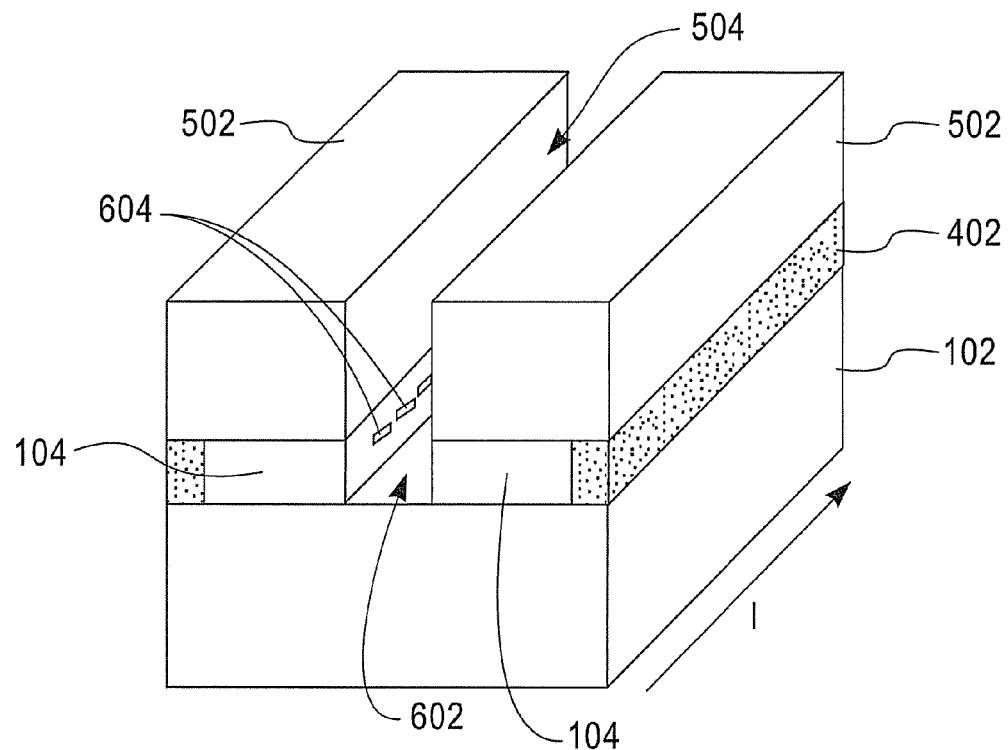
FIG. 6 shows the structure of FIG. 5 after the source/drain layer has been separated into two portion to expose catalyst sites.

After the removed gate region 504 has been formed, and as shown in FIG. 6, exposed S/D layer 104 (along with any embedded portions of the catalyst layer 106 and spacer 204) may be removed in the area under the removed gate region 504 to form an exposure region 602. This may be done, for example, by utilizing an RIE process or a sputtering process depending on the composition of the S/D layer. Removing the S/D layer 104 under the removed gate region 504 will expose the remaining portions of the catalyst layer 106 that extend in a direction that crosses the direction the removed gate region was formed in. The exposed remaining portions of the catalyst layer 106 shall be referred to herein as catalyst sites and are identified by reference numeral 604 in FIG. 6.

As discussed above, the size and position of the catalyst sites 604 may be precisely defined. Accurately defined size and position of the catalyst sites may allow for the formation of consistently sized nanostructures that may be precisely placed.

Figure 7:
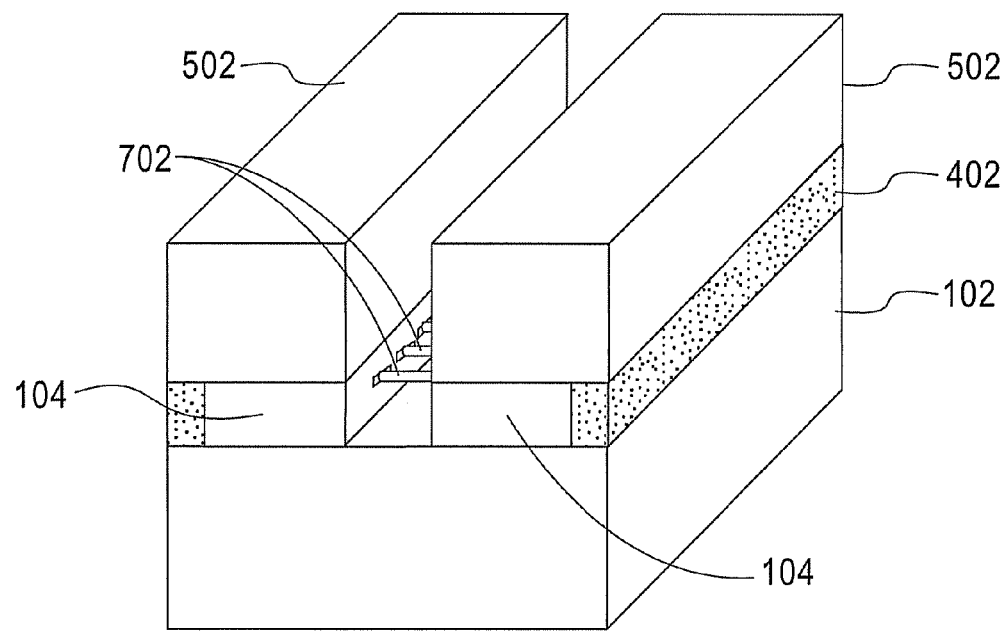
FIG. 7 shows the structure of FIG. 6 after nanostructures have been grown between the source and drain.

FIG. 7 shows the structure of FIG. 6 after nanostructures 702 (have been grown from the catalyst sites 602 (FIG. 6). The nanostructures 702 may be carbon nanotubes or semiconducting nanowires. The nanostructures 702 may be formed by chemical vapor deposition to promote catalytic growth. In one embodiment, the nanostructures 702 are grown perpendicular or nearly perpendicular to an upper surface of the substrate 102. The nanostructures 702 are grown starting from the catalyst sites 602 (FIG. 6) and span the exposure region 602. The nanostructures 702 will form the channels between the source and drain in the FET device formed according to the present invention.

Figure 8:
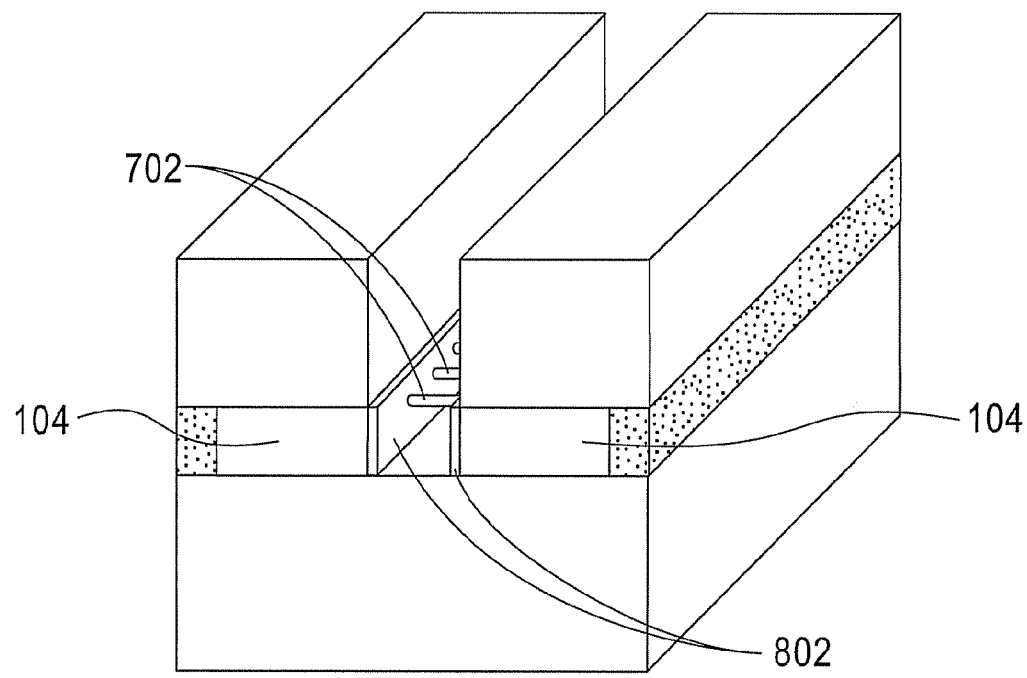
FIG. 8 shows the inclusion of metal contacts on the sides of the source and drain.

FIG. 8 shows the structure of FIG. 7 after metal contacts 802 have been formed on the sides (but not the bottom) of the exposure region 602. The metal contact 802 may metal or silicide that is selectively deposited or formed on S/D material 104 but not substrate material 102 or nanostructure 702. The metal contact 802 ensures a good electrical connection between the nanostructure 702 and the S/D layer 104. For a CMOS solution, different metals may be used for n-type FETs vs. p-type FETs.

Figure 9:
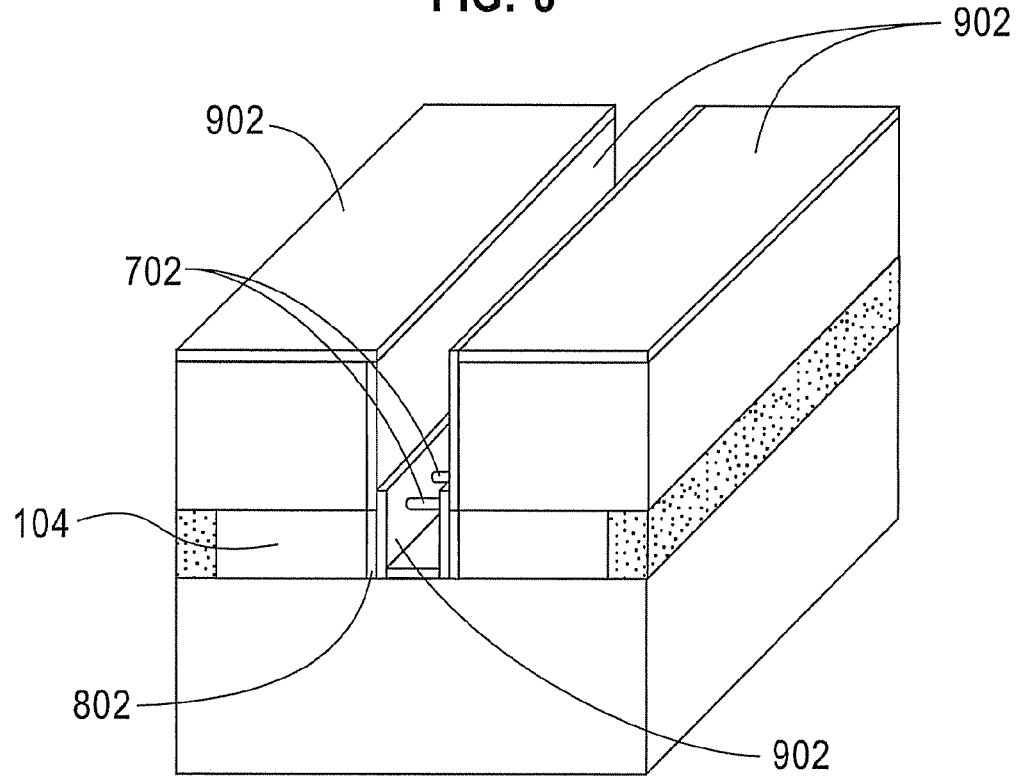
FIG. 9 shows a spacer disposed on the source and drain.

FIG. 9 shows the structure of FIG. 8 after exposed surfaces including at least any exposed portion of S/D 104 and metal contact 802, and not including at least an exposed portion of nanostructure 702 have been coated with a spacer 902. The spacer 902 may be silicon or boron nitride. In one embodiment, selective deposition or removal may be utilized to ensure that the spacer 902 covers S/D 104 and metal contacts 802, but not the nanostructures 702.

Before or after the spacer 902 is formed, the metallic nanostructures (as opposed to the semi-conducting nanostructures) are deactivated utilizing known techniques and/or techniques which are currently under development. In addition, the nanostructures 702 may also be functionalized so that gate dielectric material may stick to them. Then, a gate dielectric material is deposited at least on the nanostructure 702, and optionally on other exposed surfaces as well.

Figure 10:
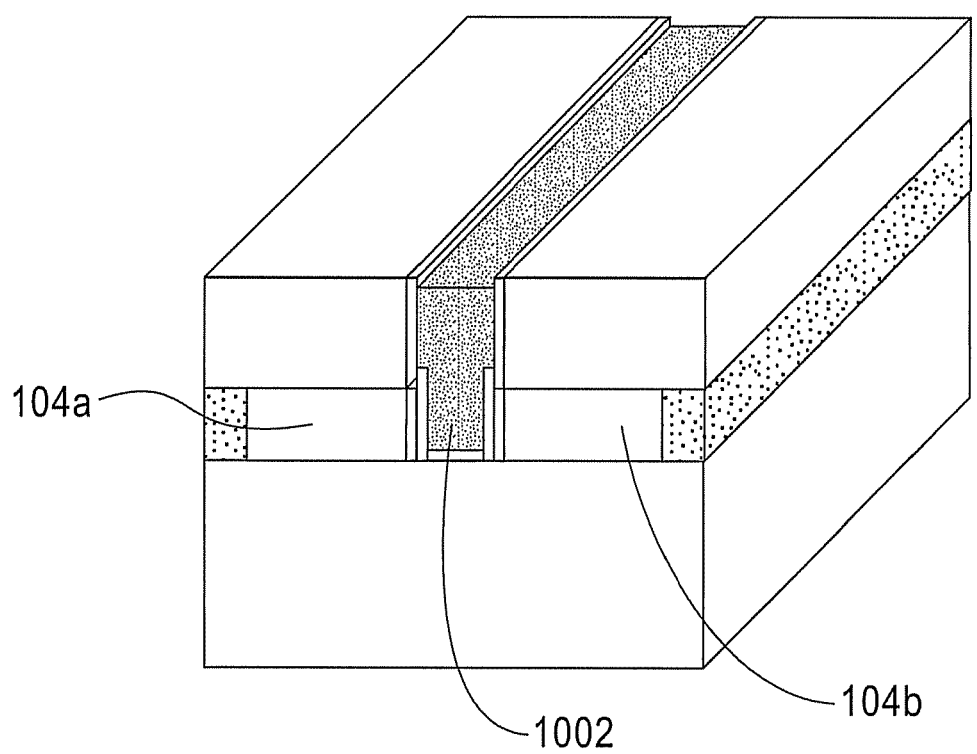
FIG. 10 shows a gate filling a space between the source and drain and surrounding the nanostructures.

Then, at shown in FIG. 10, a gate 1002 is formed by filling the open portions of the structure shown in FIG. 9. In one embodiment, the gate 1002 is metal gate. In one embodiment, the structure of FIG. 10 may be planed to the desired height.

FIG. 10 shows a FET having a gate 104a and drain 104b (or vice versa). The channel is formed by the nanostructures 702 (not shown). Application of a voltage to the gate 1002 controls conduction of current through the nanostructures. A FET so formed may have improved leakage control because the gate 1002 completely surrounds the channel (nanostructures 702).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a field effect transistor (FET), the method comprising:
   forming a source/drain (S/D) layer on a substrate, the S/D layer having a first thickness;
   forming a catalyst layer over the S/D layer;
   patterning the catalyst layer to create remaining catalyst layer portions;
   increasing the thickness of the S/D layer from the first thickness to a second thickness greater than the first thickness to encase the remaining catalyst layer portions;
   dividing the S/D layer into a source and a drain, dividing including exposing portions of the remaining catalyst layer portions, the exposed portions forming catalyst sites; and
   growing nanostructures between the source and the drain from the catalyst sites.

2. The method of claim 1, further comprising:
   filling an area between the source and the drain with a gate, wherein the gate surrounds the nanostructures.

3. The method of claim 1, further comprising:
   forming a metal contact layer on sides of the drain and source, the metal contact layer contacting the nanostructures; and
   filling an area between the source and the drain with a gate, wherein the gate surrounds the nanostructures.

4. The method of claim 1, further comprising:
   deactivating metallic nanostructures; and
   functionalizing semiconducting nanostructures.

5. The method of claim 1, wherein the S/D layer is a metallic layer.

6. The method of claim 1, wherein the S/D layer is a silicon layer.

7. The method of claim 1, wherein the nanostructure is carbon nanostructure.

8. The method of claim 7, wherein the carbon nanostructure is a carbon nanotube or a carbon nanowire.

9. The method of claim 1, wherein the nanostructures are grown parallel to an upper surface of the substrate.

10. A method of forming a field effect transistor, the method comprising:
    forming a source/drain (S/D) layer, wherein forming includes depositing portions of a catalyst layer within the S/D layer;
    dividing the S/D layer into a source and a drain, dividing including exposing portions of the catalyst layer, the exposed portions forming catalyst sites; and
    growing nanostructures between the source and the drain from the catalyst sites.

11. The method of claim 10, further comprising:
    filling an area between the source and the drain with a gate, wherein the gate surrounds the nanostructures.

12. The method of claim 10, further comprising:
    forming a metal contact layer on sides of the drain and source, the metal contact layer contacting the nanostructures; and
    filling an area between the source and the drain with a gate, wherein the gate surrounds the nanostructures.

* * * * *